United States Patent
Stuenkel et al.

(10) Patent No.: US 10,056,891 B1
(45) Date of Patent: Aug. 21, 2018

(54) DUTY CYCLE ADJUSTMENT CIRCUIT

(71) Applicant: BAE SYSTEMS Information and Electronic Systems Integration Inc., Nashua, NH (US)

(72) Inventors: Mark E. Stuenkel, Goffstown, NH (US); Lawrence J. Kushner, Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/908,381

(22) Filed: Feb. 28, 2018

(51) Int. Cl.
*H03M 1/66* (2006.01)
*H03K 5/156* (2006.01)
*H03K 5/159* (2006.01)

(52) U.S. Cl.
CPC .......... *H03K 5/1565* (2013.01); *H03M 1/662* (2013.01); *H03K 5/159* (2013.01)

(58) Field of Classification Search
CPC ...... H03K 5/1565; H03K 5/159; H03M 1/662
USPC .................................. 341/144, 155
See application file for complete search history.

(56) References Cited

U.S. PATENT DOCUMENTS

| | | | |
|---|---|---|---|
| 7,292,499 B2 | 11/2007 | Byun | |
| 9,729,131 B2 * | 8/2017 | Kitagawa | H03K 5/159 |
| 9,954,517 B2 * | 4/2018 | Ma | H03K 5/1565 |
| 9,985,618 B2 * | 5/2018 | Park | H03K 5/1565 |

OTHER PUBLICATIONS

Melikyan, Vazgen, et al, "Low Power Duty Cycle Adjustment Simple Method in High Speed Serial Links", 2015, East-West Design & Test Symposium (EWDTS), IEEE, Sep. 26-29, 2015, pp. 1-4.

Raja, Immanuel, et al., "A 0.1-3.5-GHz Duty-Cycle Measurement and Correction Technique in 130-nm CMOS", IEEE Transactions on Very Large Scale Integration (VLSI) Systems, May 2016, vol. 24, No. 5, pp. 1975-1983.

Song, Keun-Soo, et al., "Single-Loop DLL Using an or-and Duty-Cycle Correction Technique", IEEE Asian Solid-State Circuits Conference, Nov. 3-5, 2008, Fukuoka, Japan, pp. 245-248.

\* cited by examiner

*Primary Examiner* — Brian Young
(74) *Attorney, Agent, or Firm* — Finch & Maloney PLLC

(57) ABSTRACT

A duty cycle adjustment circuit includes: a delay circuit to delay an input clock signal to produce a delayed clock signal having a rising edge partially overlapping the rising edge of the input clock signal, the input clock signal oscillating between first and second values about a midpoint value; a blender circuit to blend the input clock signal and the delayed clock signal to produce a blended clock signal; a buffer circuit to buffer the input clock signal for an amount of time comparable to the blender circuit, to produce a buffered clock signal; and a combiner circuit to combine the buffered and the blended clock signals to produce an output clock signal that transitions to or remains at the first value when both the buffered and blended clock signals are on the first value side of the midpoint value, and otherwise transitions to or remains at the second value.

20 Claims, 7 Drawing Sheets

Operation of Blender Circuit

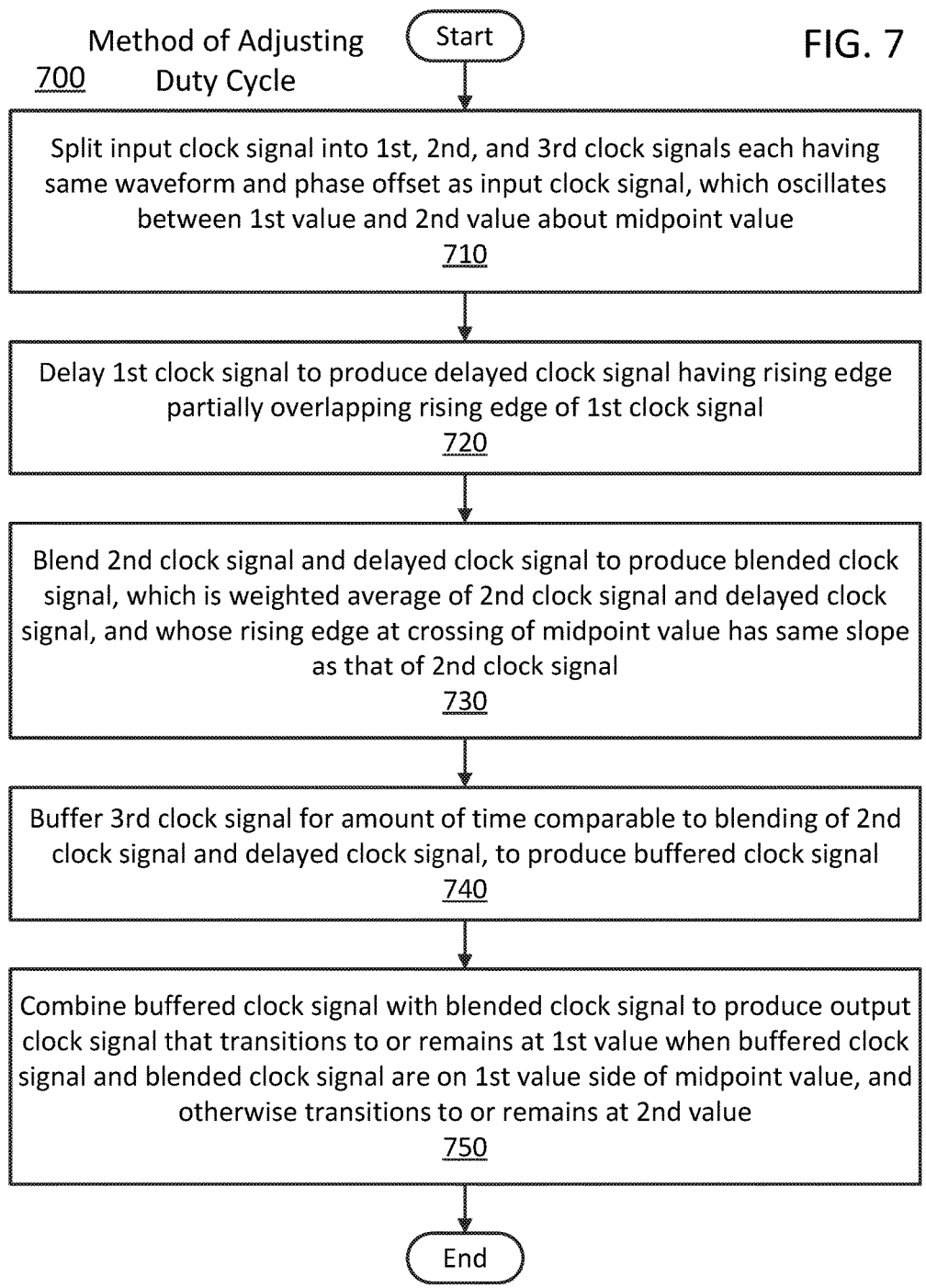

DUTY CYCLE ADJUSTMENT CIRCUIT

STATEMENT REGARDING FEDERALLY SPONSORED RESEARCH OR DEVELOPMENT

This invention was made with government support under contract W911QX-13-C-0050 awarded by the U.S. Army. The government has certain rights in the invention.

FIELD OF THE DISCLOSURE

This disclosure relates to a duty cycle adjustment circuit.

BACKGROUND

For some applications, such as high-frequency interleaved data converters, misalignment and unintended overlap of the corresponding clock signals driving the individual converters can lead to undesired side effects. In general, clock signals with mismatched duty cycles can produce unintended (and undesired) behavior in corresponding circuits driven by such clock signals. However, there are a number of non-trivial issues associated with adjusting one or more duty cycles to eliminate such overlap or other unintended timing.

BRIEF DESCRIPTION OF THE DRAWINGS

Features of embodiments of the claimed subject matter will become apparent as the following Detailed Description proceeds, and upon reference to the Drawings, wherein like numerals depict like parts.

FIG. 7 is a flow diagram of an example method of adjusting a duty cycle, according to an embodiment of the present disclosure.

Figure 1:
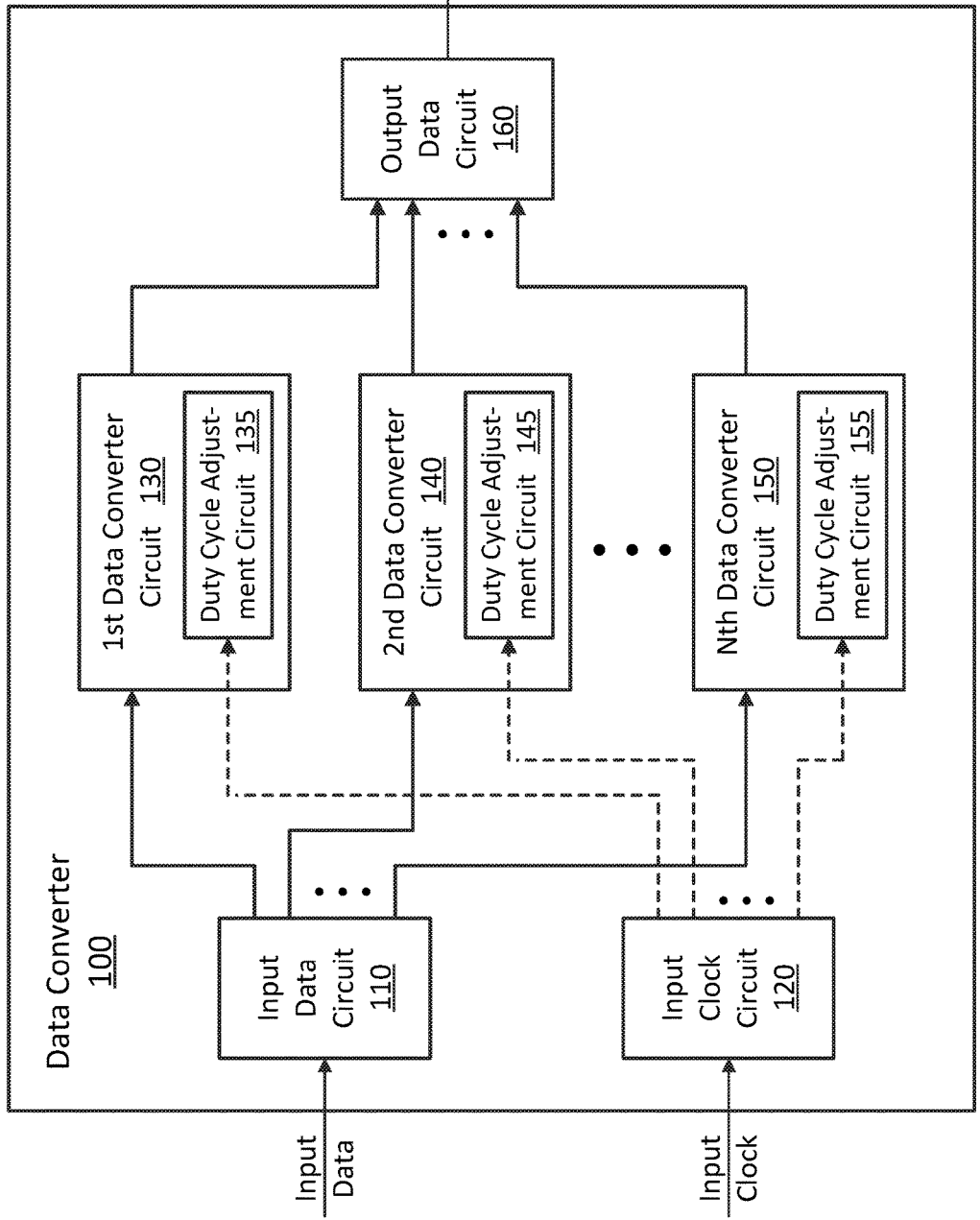
FIG. 1 is a. block diagram of an example data converter, according to an embodiment of the present disclosure.

Although the following Detailed Description will proceed with reference being made to illustrative embodiments, many alternatives, modifications, and variations thereof will be apparent to those in light of the present disclosure.

DETAILED DESCRIPTION

According to one or more embodiments of the present disclosure, a high-frequency low-jitter temperature-insensitive duty cycle adjustment circuit is provided. This duty cycle adjustment circuit helps to reduce undesired duty cycle effects (e.g., duty cycle mismatch) of circuits such as individual data converters (for example, digital to analog converters or analog to digital converters) being interleaved. In various embodiments, the duty cycle adjustment circuit splits the incoming clock signal into multiple paths, delays one of the clock paths by a tunable amount to produce a variably delayed clock signal, and combines (such as with a logical AND) the variably delayed clock signal with an undelayed clock signal to adjust the duty cycle of the resulting output clock signal. In some embodiments, the delay of the variably delayed clock signal is tuned by blending together (for example, scaling and then summing) two input clock signals that have different time delays or phase offsets. Scaling the two input clock signals by variable weights allows the delay of the blended clock signal to be tuned. Further, in some embodiments, when logically combined (such as ANDed) with a reference undelayed or unblended clock signal, the variable time delay becomes a duty-cycle adjustment. Through such tuning, the duty cycles of the different clock signals can be reduced just enough to get rid of unintended duty cycle overlap while keeping the nonoverlapped portions as large as possible and matched, which increases or maximizes the performance of circuits such as multiple interleaved digital-to-analog converters (DACs) driven by such tuned clock signals.

General Overview

As mentioned above, there are a number of non-trivial issues associated with adjusting a duty cycle or duty cycles to eliminate overlap or other unintended mismatches. Ignoring such overlap or unintended mismatches can be harmful. For example, the overlapping of duty cycles of clock signals for driving multiple interleaved circuits such as data converters can lead to undesired side effects. These effects include interleaving spurs, increased signal to noise and distortion (SiNAD) ratio, decreased effective number of bits (ENOB), decreased spurious free dynamic range (SFDR), and increased magnitude mismatch of the individual converters. For instance, the magnitude mismatch can generate unwanted tones in the interleaved output at the fundamental and the aliased frequencies of the individual converters. However, simply reducing the duty cycles to address the problems directly cuts the performance or output of the circuits driven by the corresponding clock signals. Furthermore, other techniques to adjust the duty cycle also have their own problems. For example, altering the duty cycle by slowing down clock edges increases jitter, which directly increases a circuit's (such as a data converter circuit's) spectral noise density. For another example, altering the duty cycle by altering the digital switching threshold of digital circuits in the clock path is problematic, as digital switching thresholds are temperature and process dependent, making the duty cycle adjustment circuits that rely on them vary across temperature and from chip to chip. Other techniques are also prone to breakdown when driving high frequency clock signals, such as those in excess of 500 megahertz (MHZ) or 1 or more gigahertz (GHz).

Accordingly, and in various embodiments, the magnitude of undesired interleaving spurs is reduced. These undesired interleaving spurs occur, for example, when multiple individual data converters, such as analog-digital converters (ADCs) or digital-analog converters (DACs), are interleaved. The spurs can cause increased magnitude mismatch of the converters. By reducing or minimizing this magnitude mismatch, various embodiments increase overall converter performance. Various embodiments have low jitter since, for example, high edge rates are maintained throughout. In addition, various embodiments are relatively insensitive to temperature effects since, for example, characteristics of the clock blender circuit (for generating the variably delayed clock signal) are matched by a corresponding clock buffer circuit (for buffering an input clock signal for combining with the variably delayed clock signal). A duty cycle adjustment circuit according to one or more embodiments maintains a constant jitter across tuning state, in contrast to other techniques that vary edge rates and have higher jitter that varies with tuning state. Various embodiments are implemented in a high-speed n-type technology such as indium phosphide (InP) and silicon germanium (SiGe) heterojunction bipolar transistor (HBT) technologies, which operate at frequencies higher than those achievable with other techniques. In various embodiments, a duty cycle adjustment circuit is used in any system that requires fine resolution tuning or correction of a clock signal's duty cycle. Numerous other example embodiments and configurations will be apparent in light of this disclosure.

For example, in one embodiment, a duty cycle adjustment circuit is provided. The duty cycle adjustment circuit includes a delay circuit to delay an input clock signal to produce a delayed clock signal having a rising edge partially overlapping the rising edge of the input clock signal (for example, the delay is less than the length of the rising edge of the input clock signal, such as half the length of the rising edge). The input clock signal oscillates between a first value (such as a high voltage) and a second value (such as a low voltage) about a midpoint value (such as zero voltage). The duty cycle adjustment circuit further includes a blender circuit to blend the input clock signal and the delayed clock signal to produce a variably delayed (or blended) clock signal. The duty cycle adjustment circuit further includes a buffer circuit to buffer the input clock signal for an amount of time comparable to that of the blender circuit, to produce a buffered clock signal. For instance, the buffer circuit can be implemented with similar design and location to the blender circuit, and be configured to delay the input clock signal by the same delay (or substantially the same delay) on the input clock signal as that imparted by the blender circuit.

The duty cycle adjustment circuit further includes a combiner circuit to combine (such as with a logical AND gate) the buffered clock signal and the blended clock signal to produce an output clock signal that transitions to or remains at the first value when the buffered clock signal and the blended clock signal are on the first value side of the midpoint value, and otherwise transitions to or remains at the second value. For instance, the output signal can rise to or remain at the first value (such as a high voltage) when both the buffered clock signal and the blended clock signal are at a high value (or high voltage), and fall to or remain at the second value (such as a low voltage) when either of the buffered clock signal or the blended clock signal is not at a high value (or high voltage). Numerous other embodiments will be apparent.

System Architecture

FIG. 1 is a block diagram of an example data converter 100, according to an embodiment of the present disclosure. For example, the data converter 100 can be a digital to analog converter (DAC) or analog to digital converter (ADC). The data converter 100 includes a plurality of interleaved data converter circuits, such as a first data converter circuit 130, a second data converter circuit 140, . . . , and an Nth data converter circuit 150. Each of the interleaved data converter circuits includes a duty cycle adjustment circuit, such as duty cycle adjustment circuit 135 for the first data converter circuit 130, duty cycle adjustment circuit 145 for the second data converter circuit 140, . . . , and duty cycle adjustment circuit 155 for the Nth data converter circuit 150. N can be any integer greater than one, such as two, three, four, or more.

The data converter 100 further includes an input data circuit 110 for interleaving the input data of the data converter 100 to N different input streams, each input stream being directed to a corresponding one of the N interleaved data converter circuits. The data converter 100 also includes an input clock circuit 120 for generating N different clock signals, each clock signal, due to mismatches in the physical circuitry, potentially having a different duty cycle for driving a corresponding one of the N interleaved data converter circuits. To reduce or prevent unintended effects such as duty cycle mismatch, the clock signals are input to the respective duty cycle adjustment circuits of the interleaved data converter circuits, which adjust the duty cycles to reduce or prevent such effects. The interleaved data converter circuits 130, 140, . . . , 150 output their corresponding converted input data to an output data circuit 160 that combines the different converted input data streams into an output data stream. Embodiments of the duty cycle adjustment circuits will be described in further detail with reference to FIGS. 2-7.

Figure 2:
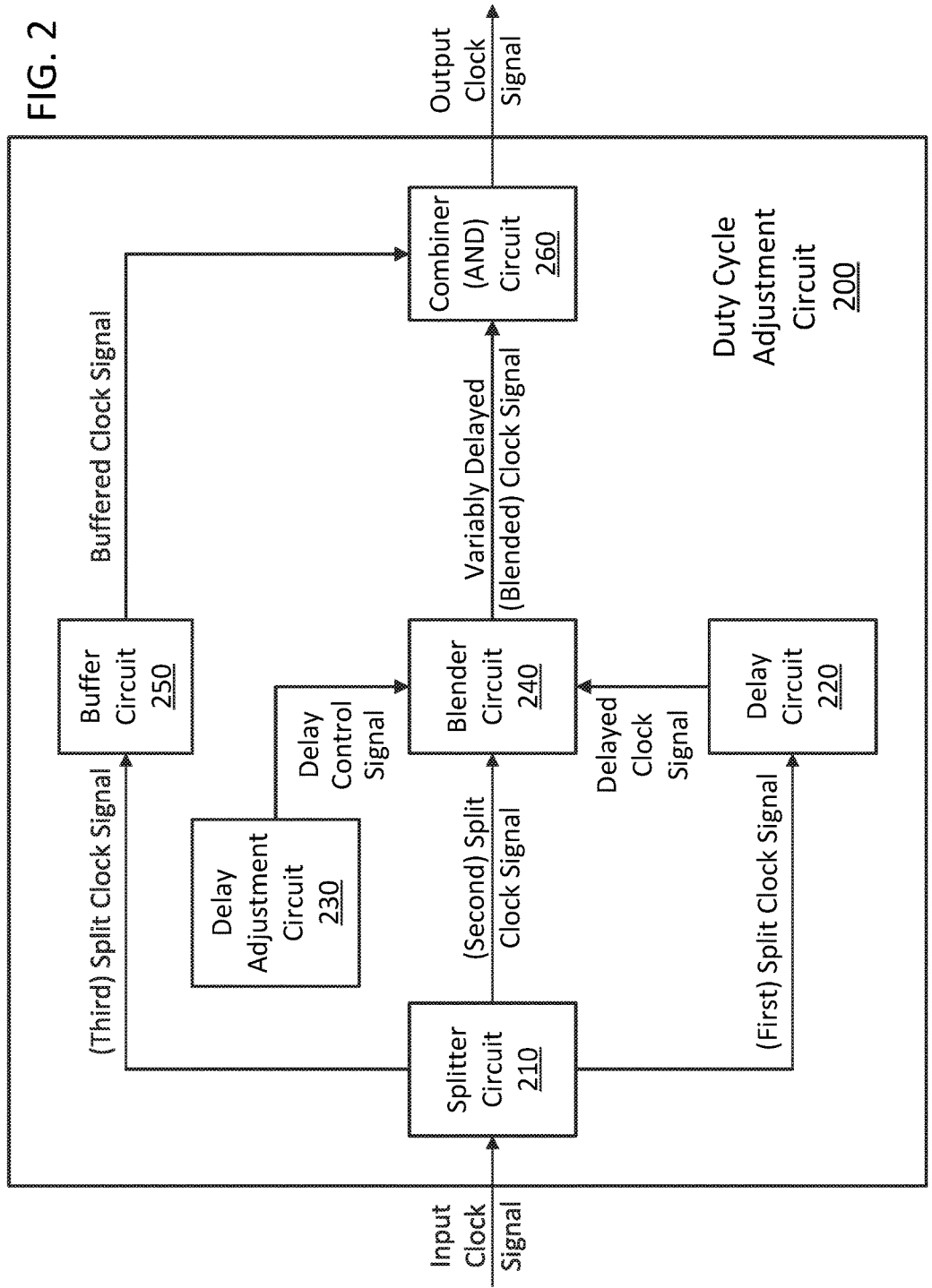
FIG. 2 is a block diagram of an example duty cycle adjustment circuit, according to an embodiment of the present disclosure.

FIG. 2 is a block diagram of an example duty cycle adjustment circuit 200, according to an embodiment of the present disclosure. The duty cycle adjustment circuit 200 and other electronic components or circuits described herein can be implemented as an integrated circuit in a semiconductor fabrication technology, such as complementary metal-oxide semiconductor (CMOS) or n-type MOS (NMOS), to name a few. For example, the duty cycle adjustment circuit 200 and other circuits disclosed herein may be custom hardware circuits or computer circuits configured (e.g., through predefined or customized logic, to name a few) to carry out the tasks assigned to the circuit. While circuits are illustrated as being made up of other circuits by function, in other embodiments, two or more circuits may be combined into a single circuit performing the functionality of the two or more circuits. In still other embodiments, a single circuit can be divided into two or more circuits, each performing separate functions performed by the single circuit. As will be further appreciated, a circuit as used herein is a physical structure capable of carrying out one or more functionalities as variously provided herein. For example, the structure can be hardware such as purpose-built semiconductor (e.g., gate-level logic or application specific integrated circuit) or a printed circuit board populated with discrete components configured and arranged to carry out the various functionalities provided herein. Numerous such embodiments and configurations will be appreciated in light of this disclosure.

Referring to FIG. 2, the duty cycle adjustment circuit 200 receives an input clock signal that oscillates between a low (e.g., negative) value and a high (e.g., positive) value about a zero (or midpoint) value. The input clock signal has a particular duty cycle (for example, period in which the input clock signal is positive), and generates an output clock signal having an adjusted duty cycle (such as a shorter such cycle that is as long as possible without overlapping another such adjusted duty cycle). To this end, the input clock signal is received by a splitter circuit 210, which splits the input clock signal into three clock signals each having the same (or substantially the same) waveform and phase offset as the input clock signal. For example, the splitter circuit 210 splits the input clock signal into first, second, and third clock signals, and sends the three clock signals to three different component circuits of the duty cycle adjustment circuit 200, as described further below.

For instance, the splitter circuit sends the first clock signal to a delay circuit 220 to delay the first clock signal to produce a delayed clock signal having a rising edge partially overlapping the rising edge of the first clock signal. In one embodiment, the delay circuit 220 delays the first clock signal by half the length (or about half the length) of the rising edge of the first clock signal. In some other embodiments, the delay circuit 220 delays the first clock signal for another portion of the rising edge of the first clock signal.

The delayed clock signal is supplied from the delay circuit 220 to a blender circuit 240 along with the second (e.g., undelayed) clock signal from the splitter circuit 210. The second clock signal and the delayed clock signal have rising edges that overlap, the delayed clock signal having a later rising edge than the second clock signal. The blender circuit 240 blends (e.g., forms a weighted average of) the delayed clock signal and the second clock signal to produce a blended or variably delayed clock signal. The blended clock signal is a variable delay of the input clock signal, allowing the duty cycle to be adjusted (delayed, in this case) by tuning the delay of the blended (or variably delayed) clock signal. Since the variable delay is a tunable fraction of only a portion of the rising edge of the input clock signal, the variable delay can be a small precise delay of input clock signal, which allows for precise adjusting of the duty cycle as will described further below See FIG. 3 for an example blender circuit 240.

The blending percentage (or amount of variable delay) can be controlled by a delay adjustment circuit 230, which supplies a delay control signal (e.g., weights) to the blender circuit 240 to control the blending of the second clock signal and the delayed clock signal. See FIGS. 4-5 for example blending and blending percentages. For instance, the delay control signal can control equal blending or mixing of the second clock signal and the delayed clock signal in the blended clock signal, so that the blended clock signal has a signal value at any particular time that is the average of the signal values of the second clock signal and the delayed clock signal at that time. Since the delayed clock signal and the second clock signal have the same duty cycle, the weighted average (e.g., blended clock signal) of the delayed clock signal and the second clock signal shares this same duty cycle. However, the duty cycle of the delayed clock signal is offset (e.g., delayed) relative to the duty cycle of the second clock signal.

The blender circuit 240 produces two types of delay in the blended clock signal relative to the second clock signal (or first clock signal or third clock signal) that is input to the blender circuit 240. The first type of delay is as is described above, namely the variable delay incurred from taking a weighted average of the second clock signal and the delayed clock signal. This delay increases proportionally to the weight assigned to the delayed clock signal relative to the weight assigned to the second clock signal.

The second type of delay reflects the amount of time the input signals (e.g., the second clock signal and the delayed clock signal in this case) take to propagate through the blender circuit 240 and be reflected in the blended clock signal that is output from the blender circuit 240. For instance, even if the blending percentage is 100% for the second clock signal and 0% for the delayed clock signal, the blended clock signal output from the blender circuit 240 will still be delayed relative to the second clock signal that is input to the blender circuit 240. The same phenomenon is also true if the blending percentage is 100% for the delayed clock signal and 0% for the second clock signal: the blended clock signal will be delayed relative to the delayed clock signal. This is because the blending circuitry in the blender circuit 240 by itself adds delay to the input signals, such as the second clock signal and the delayed clock signal.

Accordingly, to counteract this second type of delay and provide another copy of the input clock signal for processing with the blended clock signal, a buffer circuit 250 buffers the third clock signal for an amount of time comparable to that of the blender circuit 240 (e.g., the second type of delay introduced by the blender circuit 240), to produce a buffered clock signal. For instance, in one embodiment, the buffer circuit 250 uses similar circuits or components to that of the blender circuit 240, and is located near the blender circuit 240, so that delays encountered by the blender circuit 240 (e.g., circuit or temperature related delays such as the second type of delay discussed above) are mirrored in the buffer circuit 250. Thus, the buffered clock signal from the buffer circuit 250 is delayed from the input clock signal (e.g., the third clock signal) by a comparable amount (of second type of delay) to the delay of the blended clock signal from the input clock signal (e.g., the second clock signal) or another signal input to the blender circuit 240 (e.g., the delayed clock signal).

The blended clock signal from the blender circuit 240 and the buffered clock signal from the buffer circuit 250 are input to a combiner circuit 260 (such as a logical AND gate) to produce the output clock signal. For instance, the output clock signal can represent the logical AND of the blended clock signal and the buffered clock signal, to reduce the duty cycle of the output clock signal. In some embodiments, the combiner circuit 260 combines the buffered clock signal and the blended clock signal to produce the output clock signal. The output signal transitions to or remains at the high value when the buffered clock signal and the blended clock signal are positive (e.g., both in their high state), and otherwise transitions to or remains at the low value (e.g., when at least one of the blended clock signal and the buffered signal is negative).

The input clock signal, the first clock signal, the second clock signal, the third clock signal, the blended clock signal, and the buffered clock signal all have the same duty cycle, but not necessarily the same offset (e.g., phase delay). For instance, the blended clock signal is delayed or offset from the buffered clock signal. Accordingly, the output clock signal (as a logical AND of the blended clock signal and the buffered clock signal) has a shorter duty cycle than either the blended clock signal or the buffered clock signal. Put another way, the length of the clock pulse (e.g., the portion of the clock signal when it is at its high value) for the output clock signal is comparable to the length of the overlap of the clock pulses of the blended clock signal and the buffered clock signal. Since the clock pulses of the blended clock signal and the buffered clock signal are the same length and only partially overlap, the output clock signal has a shorter duty cycle than either the blended clock signal or the buffered clock signal.

Accordingly, by tuning the blended clock signal, the duty cycle of the output clock signal can be adjusted, which is useful for applications such as interleaving multiple data converters (e.g., DACs). For example, the width of the DAC output pulses can be adjusted by tuning the duty cycle of the output clock signal of the duty cycle adjustment circuit 200. Thus, the duty cycle adjustment circuit 200 maintains good jitter performance as this circuit sets the DAC's output jitter. The duty cycle adjustment circuit 200 can accomplish this output clock signal from the input clock signal using components such as a passive delay (e.g., delay circuit 220), a phase blender (e.g., blender circuit 240), and an AND gate (e.g., combiner circuit 260) to adjust the clock edges to the desired duty cycle (e.g., as long as possible but without unintended overlap with the duty cycles of other of the interleaved DACs).

The duty cycle adjustment circuit 200 can be implemented with high frequency clock cycles, such as input clock signals with frequencies in excess of 100 megahertz (MHz), including 125 MHz, 250 MHz, 500 MHz, 1 gigahertz (GHz), 2 GHz, 5 GHz, 10 GHz, and 16 GHz. The higher clock frequencies can be achieved, for example, using high speed semiconductor technology, such as heterojunction bipolar transistor (HBT) technology including one or both of an indium phosphide (InP) HBT structure and a silicon germanium (SiGe) HBT structure. The InP HBT structure has an emitter region that includes indium (In) and phosphorus (P), and the SiGe HBT structure has a base region that includes silicon (Si) and germanium (Ge). Other HBT technologies can also be used.

Figure 3:
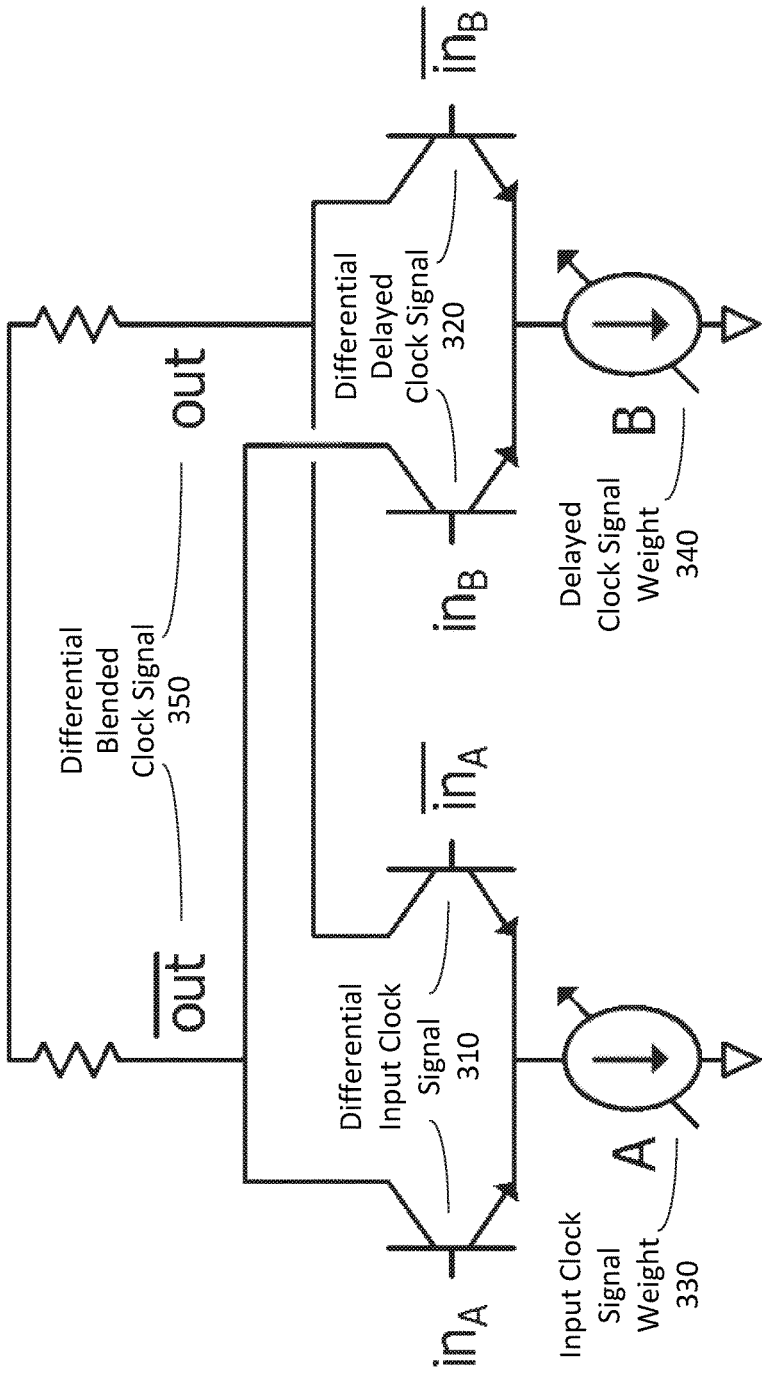
FIG. 3 is a schematic diagram of an example blender circuit of the duty cycle adjustment circuit of FIG. 2, according to an embodiment of the present disclosure.

FIG. 3 is a schematic diagram of an example blender circuit 300 of the duty cycle adjustment circuit 200 of FIG. 2, according to an embodiment of the present disclosure. The input and output signals of the blender circuit 300 are illustrated as differential signals. In a similar fashion, the input and output signals of other circuits of the duty cycle adjustment circuit 200 can be differential signals. Differential signals can help with high frequency signals and with reducing or eliminating environmental (e.g., temperature, radiation, electronic crosstalk, electromagnetic interference) effects on the transmission of different signals. However, in other embodiments, single-ended signaling is used, such as using a single wire to transmit an electrical signal using a voltage relative to a reference or ground voltage.

In the blender circuit 300 of FIG. 3, there is a differential input clock signal 310 and a differential delayed clock signal 320 that are blended to produce a differential blended (or variably delayed) clock signal 350. The blender circuit 300 sums the input clock signal 310 and the delayed clock signal 320 together. The blending is controlled by two weights (e.g., as supplied by the delay adjustment circuit 230), namely an input clock signal weight 330 and a delayed clock signal weight 340, for weighting the input clock signal 310 and the delayed clock signal 320, respectively. Adjusting the magnitude of the input clock signal current source 330 and the delayed clock signal current source 340 tunes the blended clock signal that is output from the blender circuit 300. The blended clock signal 350 is thus a weighted average of the input clock signal 310 and the delayed clock signal 320. The blended clock signal 350 can be delayed from the input clock signal 310 by any amount from zero up to the delay of the delayed clock signal 320, depending on the weights.

Figure 4:
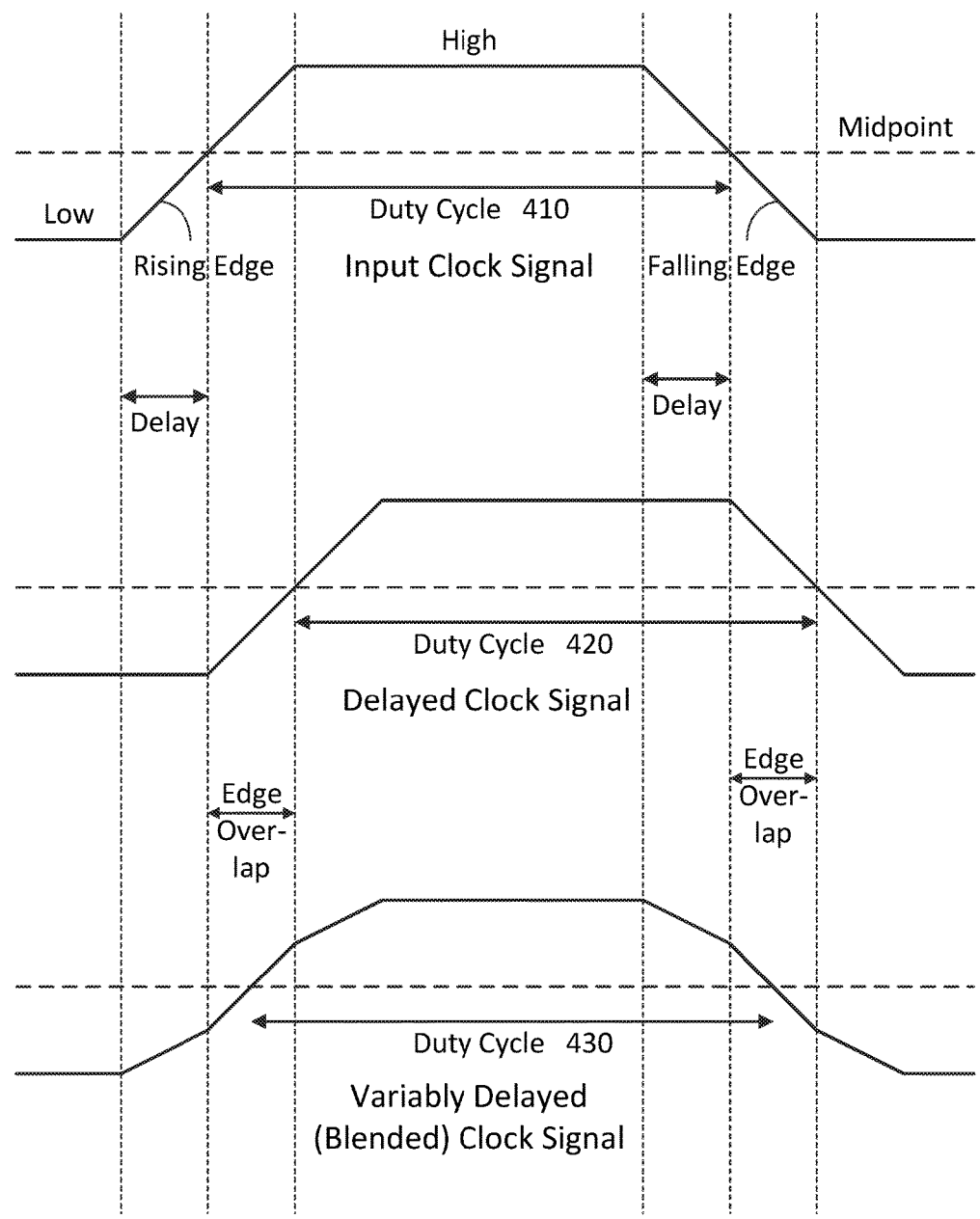
FIG. 4 is a graphical depiction of example waveforms of signals for driving the blender circuit of FIG. 3, according to an embodiment of the present disclosure.
Figure 5:
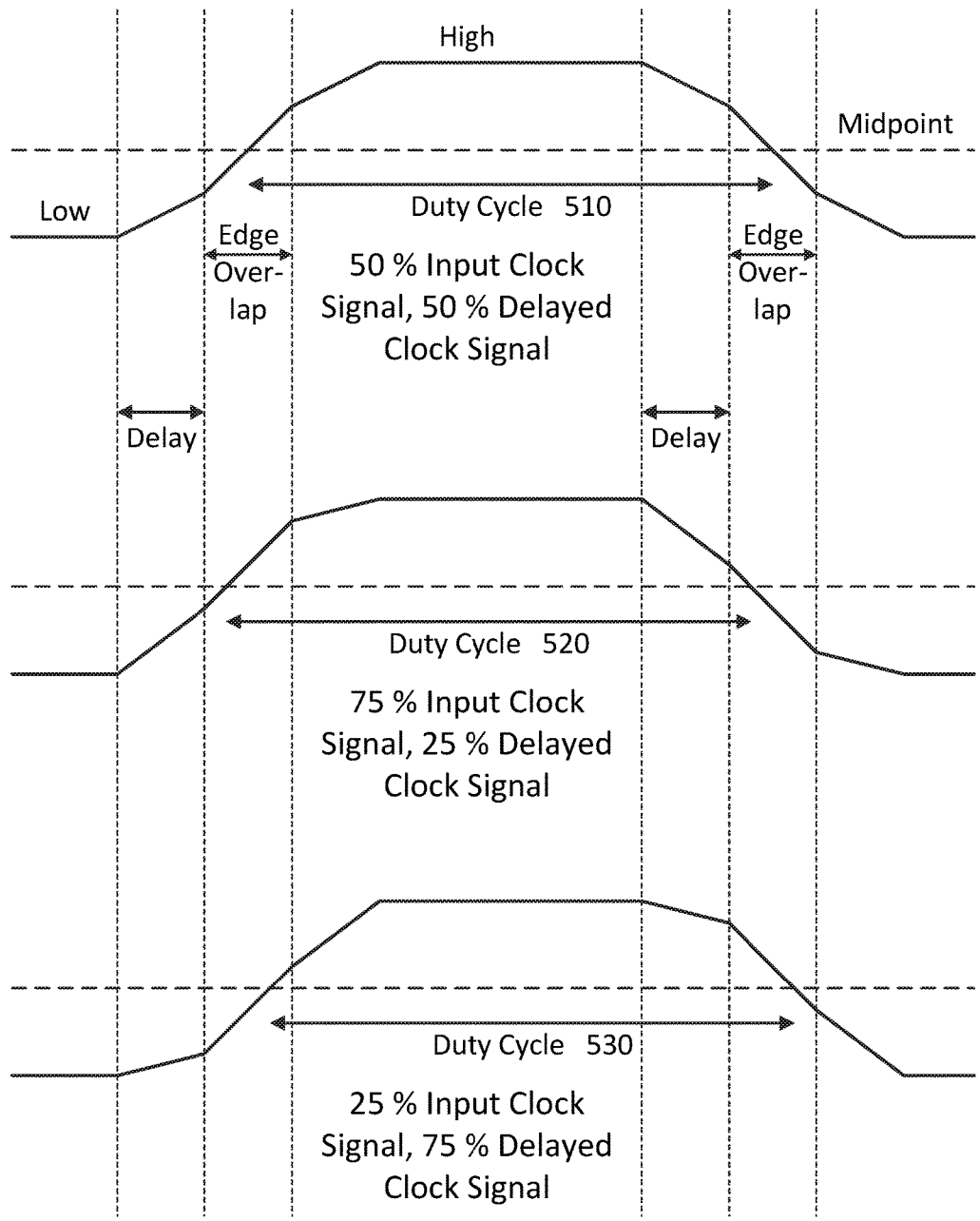
FIG. 5 is a graphical depiction of example waveforms of blended clock signals for different blending percentages (weighted averages) of an input clock signal and a delayed clock signal for driving the blender circuit of FIG. 3, according to an embodiment of the present disclosure.

Put another way, tuning the magnitudes of the input clock signal current source 330 and the delayed clock signal current source 340 adjusts the zero crossing of the blended clock signal (as can be seen in FIGS. 4-5 below). Furthermore, if the total current from the input clock signal current source 330 and the delayed clock signal current source 340 is held constant, then the signal slope at the zero crossing is constant, which leads to little jitter variation in the clock signals derived from the blended clock signal. In addition, delaying the variably delayed clock signal reduces the duty cycle of the output of the combiner circuit 260 (or AND gate), as described further below, which further adjusts the output clock signal's duty cycle.

FIG. 4 is a graphical depiction of example waveforms of signals for driving the blender circuit 300 of FIG. 3, according to an embodiment of the present disclosure. The depictions of these and other waveforms are stylized for ease of description and demonstration. Actual waveforms can vary significantly between embodiments as would be apparent in light of the disclosure. For instance, slopes may be more pronounced (such as a much smaller proportion of the duty cycle or clock cycle), lines more curved (and with imperfections like small dips and rises in places), and minimum (low) and maximum (high) portions less flat and distinct than is depicted in FIG. 4 and other drawings.

Referring to FIG. 4, there are three waveforms depicted, including a duty cycle of each. From top to bottom, example waveforms of the input clock signal, the delayed clock signal, and the blended clock signal are depicted. In this case, the blended clock signal represents a 50/50 blending of the input clock signal and the delayed clock signal (e.g., equally weighted). The top waveform (input data signal) has the rising and falling edges identified, together with vertical lines (throughout all three waveforms) showing the start, midpoint, and end of the rising and falling edges of the input clock signal. As shown, the delayed clock signal is delayed by half the length of the rising edge (and falling edge), as noted by the delay section between the start of the rising edge of the input clock signal and the middle (zero or midpoint crossing) of the rising edge of the input clock signal. As such, the rising edge (and falling edge) of the blended clock signal have three different portions: initial and final (half steep) portions corresponding to just the input clock signal and just the delayed clock signal, respectively, and a middle portion corresponding to both the input clock signal and the delayed clock signal (as indicated by the edge overlap section between the middle and end of the rising edge of the input clock signal).

The edge overlap section is important between the input clock signal and the delayed clock signal, for it represents the zero (or midpoint) crossing (start of duty cycle) of the rising edge of the blended clock signal. Because of the selection of the delay of the delayed clock signal (larger than zero and smaller than the length of the rising edge of the input clock signal), the edge overlap section of the rising edge of the blended clock signal has the same slope (or substantially the same slope) as the input clock signal. Accordingly, there is minimal or no jitter with using the blended clock signal to derive the output clock signal. This low jitter characteristic (e.g., same slope of input clock signal at zero crossing) is present regardless of the blending percentage.

On the one hand, the delay amount of the delayed clock signal sets the maximum amount of delay available in the variably delayed (or blended) clock signal, which can allow for greater tuning range. On the other hand, the delay amount of the delayed clock signal limits the size of the edge overlap region (and by extension, the low jitter portion of the zero crossing of the blended clock signal), which can impact jitter performance. Accordingly, the choice of delay amount of the delayed clock signal has to factor in the benefits (e.g., larger tuning range) versus the drawbacks (e.g., worse jitter performance) of selecting a large delay amount of the delayed clock signal. For example, half the length of the rising edge of the input clock signal is a good choice for the delay amount of the delayed clock signal, for it provides for a good tuning range for the variably delayed (blended) clock signal, and it provides for a large edge overlap portion between the input clock signal and the delayed clock signal.

The duty cycle 410 of the input clock signal extends between the middle of the rising edge and the middle of the falling edge of the input clock signal (e.g., where the input clock signal is positive or above the midpoint value). The duty cycle 420 of the delayed clock signal is the same as that of the input clock signal, only delayed by the delay amount between the input clock signal and the delayed clock signal. The duty cycle 430 of the blended clock signal is the same as that of the input clock signal and delayed clock signal, and is delayed by an amount comparable to the blending percentage of the delay of the delayed clock signal. For example, with a 50/50 blending percentage of the input clock signal and the delayed clock signal, the variably delayed (blended) clock signal has a duty cycle that is delayed (from the input clock signal) by half the amount of the delay of the delayed clock signal.

FIG. 5 is a graphical depiction of example waveforms of blended clock signals for different blending percentages (weighted averages) of an input clock signal and a delayed clock signal for driving the blender circuit 300 of FIG. 3, according to an embodiment of the present disclosure. Three different waveforms are depicted in FIG. 5, from top to bottom, 50/50 weighting of the input clock signal and delayed clock signal (as with the bottom waveform of FIG. 4), 75/25 weighting of the input clock signal and the delayed clock signal (e.g., three times as much weight for the input clock signal versus the delayed clock signal), and 25/75 weighting of the input clock signal and the delayed clock signal (e.g., one-third the weight for the input clock signal versus the delayed clock signal).

As can be seen in FIG. 5, the blending percentage affects the slope of the rising edge of the blended clock signal in the initial and final portions, but the slope in the middle (edge overlap or zero crossing) portion remains constant and the same as that of the input clock signal and the delayed clock signal. This same slope of the rising edge of the blended clock signal as that of the input clock signal helps reduce or minimize jitter in the resulting output clock signal. The duty cycle 510 of the 50/50 weighting, the duty cycle 520 of the 75/25 weighting, and the duty cycle 530 of the 25/75 weighting are all the same, just slightly offset from one another (depending on their zero crossing). For instance, the duty cycle 510 starts halfway into the edge overlap region, while the duty cycle 520 of the 75/25 weighing starts one-quarter of the way into the edge overlap region, and the duty cycle 530 of the 25/75 weighting starts three-quarters of the way into the edge overlap region.

Figure 6:
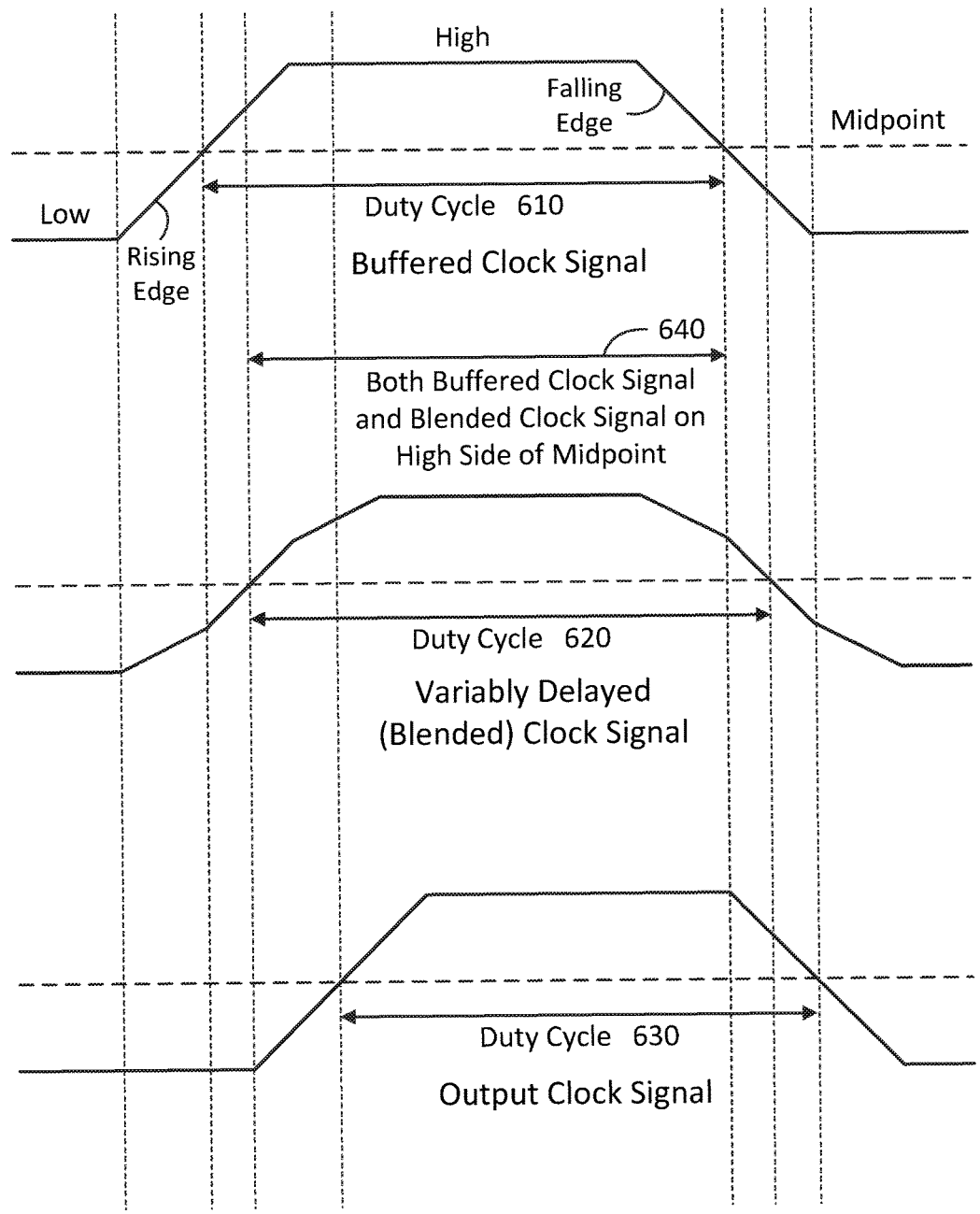
FIG. 6 is a graphical depiction of example waveforms of signals for driving the combiner (AND gate) circuit of FIG. 2, according to an embodiment of the present disclosure.

FIG. 6 is a graphical depiction of example waveforms of signals for driving the combiner (AND gate) circuit 260 of FIG. 2, according to an embodiment of the present disclosure. There are three waveforms depicted in FIG. 6, from top to bottom: the buffered clock signal, the variably delayed (blended) clock signal, and the output clock signal. The duty cycles have also been illustrated for these clock signals, with vertical lines to illustrate their relationship to the other duty cycles. The duty cycle 610 for the buffered clock signal and the duty cycle 620 for the blended clock signal are the same. However, the duty cycle 630 of the output clock signal is a little smaller than either of the buffered clock signal or the blended clock signal. This is because the duty cycle 630 of the output clock signal is governed by the combination (AND) 640 of the buffered clock signal and the blended clock signal (or more specifically, where both the buffered clock signal and the blended clock signal are on the high side of the midpoint value). During the overlap period 640, the output clock signal rises to or remains at the high value, and outside of the overlap period 640, the output clock signal falls to or remains at the low value, as can be seen in FIG. 6. This can be implemented in circuitry, for example, with a logical AND gate.

In further detail, the buffered clock signal is the same as the input clock signal, only delayed a comparable time to that of the blender circuit, while the variably delayed (blended) clock signal is a variably delayed version of the buffered clock signal. By tuning the amount of delay in the variably delayed clock signal, the duty cycle 630 of the output clock signal can be tuned, such as slightly reduced and made to not overlap the output clock signals of the duty cycle adjustment circuits of other interleaved data converter circuits. In addition, the output clock signal's duty cycle 630 can be made as large as possible to increase or maximize the magnitude match of the individual data converter circuits but kept just small enough to prevent or minimize any magnitude mismatch of the individual data converter circuits.

Methodology

FIG. 7 is a flow diagram of an example method 700 of adjusting a duty cycle, according to an embodiment of the present disclosure. The method 700 may be performed, for example, by the duty cycle adjustment circuit 200 of FIG. 2. More generally, the method 700 and other methods described herein may be implemented in hardware or combinations of hardware and software. For example, the method 700 may be implemented by the components and techniques illustrated in FIGS. 1-6. Throughout the description of the method 700, references may be made to corresponding components of the duty cycle adjustment circuit 200 of FIG. 2. In another embodiment, the method 700 may be implemented by a custom circuit such as a duty cycle adjustment circuit with custom processing circuits configured to carry out the method 700. In other embodiments, the method 700 may be performed in conjunction with a special purpose processor, such as a signal processor. In addition, while the methods described herein may appear to have a certain order to their operations, other embodiments may not be so limited. Accordingly, the order of the operations can be varied between embodiments, as would be apparent in light of this disclosure.

Referring to the method 700 of FIG. 7, an integrated circuit (IC), such as an IC implementation of the duty cycle adjustment circuit 200) begins with splitting 710, by a splitter circuit of the IC (for example, splitter circuit 210), an input clock signal into three clock signals each having the same (or substantially the same) waveform and phase offset as the input clock signal. These three copies of the input clock signal, which can be labeled a first clock signal, a second clock signal, and a third clock signal, are used as inputs to other components of the duty cycle adjustment circuit carrying out the method 700, as will be described in further detail below. The input clock signal (and by extension all clock signals split, buffered, or delayed from the input clock signal) oscillates between a first value (such as a high voltage value) and a second value (such as a low voltage value) about (or through) a midpoint value (such as a zero voltage or midpoint voltage value). When the input clock signal is on the first value side of the midpoint value (e.g., positive voltage), the input clock signal is said to be in its high state (e.g., digital high). At other times (e.g., negative voltage), the input clock signal is said to be in its low state (e.g., digital low).

The method 700 further includes delaying 720, by a delay circuit of the IC (such as delay circuit 220), the first input clock signal to produce a delayed clock signal having a rising edge partially overlapping the rising edge of the first clock signal. For example, the delay circuit can delay the first input clock signal by half the length (or about half the length) of the rising edge of the first input clock signal. It should be understood that while the description of the method 700 includes concepts such as rising edges, and positive voltages being active states of the clock signal, and the like, these concepts can be reversed (e.g., falling edges, and negative voltages being the active states of the clock signal, and the like) without departing from the spirit and scope of, and as would be apparent from, the present disclosure.

The method 700 further includes blending 730, by a blender circuit of the IC (such as blender circuit 240), the second clock signal and the delayed clock signal to produce a blended clock signal. For example, the rising edge of the second clock signal can have the same slope (or substantially the same slope) as the rising edge of the blended clock signal at the crossing of the midpoint value. In addition, the blended clock signal can be a weighted average of the second clock signal and the delayed clock signal, and the method 700 can further include setting, by a weight adjustment circuit of the IC (such as delay adjustment circuit 230) according to a specified weight value or values, weights of the second clock signal and the delayed clock signal used by the blender circuit to produce the weighted average of the second clock signal and the delayed clock signal.

The method 700 further includes buffering 740, by a buffer circuit of the IC (such as buffer circuit 250), the third clock signal for an amount of time comparable to that of the blender circuit (e.g., the amount of time the blender circuit takes to produce the blended clock signal from the input clock signal and the delayed clock signal), to produce a buffered clock signal. The blender circuit can introduce a certain amount of delay in its input signals (such as the second clock signal and the delayed clock signal) when generating the blended clock signal. This makes the blended clock signal out of sync with respect to the third clock signal. Accordingly, the buffer circuit restores this synchronization between signals by generating the buffered clock signal.

The method 700 further includes combining 750, by a combiner circuit of the IC (such as combiner circuit 260), the buffered clock signal and the blended clock signal to produce an output clock signal that transitions to or remains at (or about) the first value when the buffered clock signal and the blended clock signal are on the first value side of the midpoint value (e.g., both the buffered clock signal and the blended clock signal are in their high states), and otherwise transitions to or remains at (or about) the second value. For example, the combiner circuit can perform a logical AND function of the buffered clock signal and the blended clock signal.

Further Example Embodiments

The following examples pertain to further embodiments, from which numerous permutations and configurations will be apparent.

Example 1 is a duty cycle adjustment circuit including: a delay circuit to delay an input clock signal to produce a delayed clock signal having a rising edge partially overlapping the rising edge of the input clock signal, the input clock signal oscillating between a first value and a second value through a midpoint value, the first value being on a first side of the midpoint value, the second value being on a second side of the midpoint value opposite the first side, the first value corresponding to a digital high, the second value corresponding to a digital low; a blender circuit to blend the input clock signal and the delayed clock signal to produce a blended clock signal; a buffer circuit to buffer the input clock signal for the amount of time the blender circuit takes to produce the blended clock signal from the input clock signal and the delayed clock signal, to produce a buffered clock signal; and a combiner circuit to combine the buffered clock signal and the blended clock signal to produce an output clock signal that transitions to or remains at or about the first value when the buffered clock signal and the blended clock signal are on the first side of the midpoint value, and otherwise transitions to or remains at or about the second value.

Example 2 includes the duty cycle adjustment circuit of Example 1, further including a splitter circuit to: split the input clock signal into three clock signals each having substantially the same waveform and phase offset as the input clock signal; and connect a first one of the three clock signals to the delay circuit, a second one of the three clock signals to the blender circuit, and a third one of the three clock signals to the buffer circuit.

Example 3 includes the duty cycle adjustment circuit of Example 1, where the rising edge of the input clock signal has substantially the same slope as the rising edge of the blended clock signal at the crossing of the midpoint value.

Example 4 includes the duty cycle adjustment circuit of Example 1, where the delayed clock signal is delayed from the input clock signal by about half the length of the rising edge of the input clock signal.

Example 5 includes the duty cycle adjustment circuit of Example 1, further including a delay adjustment circuit to control the blending of the input clock signal and the delayed clock signal in the blender circuit.

Example 6 includes the duty cycle adjustment circuit of Example 1, where the blended clock signal is a weighted average of the input clock signal and the delayed clock signal.

Example 7 includes the duty cycle adjustment circuit of Example 6, further including a delay adjustment circuit to set, according to a specified weight value or values, weights of the input clock signal and the delayed clock signal used by the blender circuit to produce the weighted average of the input clock signal and the delayed clock signal.

Example 8 includes the duty cycle adjustment circuit of Example 1, where the input clock signal has a frequency of at least 500 megahertz (MHz).

Example 9 includes the duty cycle adjustment circuit of Example 1, where the duty cycle adjustment circuit is implemented in heterojunction bipolar transistor (HBT) technology including one or both of an indium phosphide (InP) HBT structure and a silicon germanium (SiGe) HBT structure, where the InP HBT structure has an emitter region that includes indium (In) and phosphorus (P), and the SiGe HBT structure has a base region that includes silicon (Si) and germanium (Ge).

Example 10 is a digital-to-analog converter (DAC) circuit including the duty cycle adjustment circuit of Example 1.

Example 11 is a data converter integrated circuit (IC) including: a plurality of interleaved data converter circuits; and an input clock signal generator to generate and distribute respective input clock signals to the interleaved data converter circuits, where a data converter circuit of the interleaved data converter circuits is configured to receive an input clock signal of the respective input clock signals, the input clock signal oscillating between a first value and a second value through a midpoint value, the first value being on a first side of the midpoint value, the second value being on a second side of the midpoint value opposite the first side, the first value corresponding to a digital high, the second value corresponding to a digital low, the data converter circuit including a duty cycle adjustment circuit, the duty cycle adjustment circuit including a delay circuit to delay the input clock signal to produce a delayed clock signal having a rising edge partially overlapping the rising edge of the input clock signal, a blender circuit to blend the input clock signal and the delayed clock signal to produce a blended clock signal, a buffer circuit to buffer the input clock signal for the amount of time the blender circuit takes to produce the blended clock signal from the input clock signal and the delayed clock signal, to produce a buffered clock signal, and a combiner circuit to combine the buffered clock signal and the blended clock signal to produce an output clock signal that transitions to or remains at or about the first value when the buffered clock signal and the blended clock signal are on the first side of the midpoint value, and otherwise transitions to or remains at or about the second value.

Example 12 includes the data converter IC of Example 11, where the duty cycle adjustment circuit further includes a splitter circuit to: split the input clock signal into three clock signals each having substantially the same waveform and phase offset as the input clock signal; and connect a first one of the three clock signals to the delay circuit, a second one of the three clock signals to the blender circuit, and a third one of the three clock signals to the buffer circuit.

Example 13 includes the data converter IC of Example 11, where the rising edge of the input clock signal has substantially the same slope as the rising edge of the blended clock signal at the crossing of the midpoint value.

Example 14 includes the data converter IC of Example 11, where the duty cycle adjustment circuit further includes a delay adjustment circuit to control the blending of the input clock signal and the delayed clock signal in the blender circuit.

Example 15 includes the data converter IC of Example 11, where the blended clock signal is a weighted average of the input clock signal and the delayed clock signal, the duty cycle adjustment circuit further including a delay adjustment circuit to set, according to a specified weight value or values, weights of the input clock signal and the delayed clock signal used by the blender circuit to produce the weighted average of the input clock signal and the delayed clock signal.

Example 16 includes the data converter IC of Example 11, where the interleaved data converter circuits are digital-to-analog converter (DAC) circuits.

Example 17 is a method of adjusting a duty cycle by an integrated circuit (IC), the method including: delaying, by a delay circuit of the IC, an input clock signal to produce a delayed clock signal having a rising edge partially overlapping the rising edge of the input clock signal, the input clock signal oscillating between a first value and a second value through a midpoint value, the first value being on a first side of the midpoint value, the second value being on a second side of the midpoint value opposite the first side, the first value corresponding to a digital high, the second value corresponding to a digital low; blending, by a blender circuit of the IC, the input clock signal and the delayed clock signal to produce a blended clock signal; buffering, by a buffer circuit of the IC, the input clock signal for the amount of time the blender circuit takes to produce the blended clock signal from the input clock signal and the delayed clock signal, to produce a buffered clock signal; and combining, by a combiner circuit of the IC, the buffered clock signal and the blended clock signal to produce an output clock signal that transitions to or remains at or about the first value when the buffered clock signal and the blended clock signal are on the first side of the midpoint value, and otherwise transitions to or remains at or about the second value.

Example 18 includes the method of Example 17, further including: splitting, by a splitter circuit of the IC, the input clock signal into three clock signals each having substantially the same waveform and phase offset as the input clock signal; and connecting, by the splitter circuit, a first one of the three clock signals to the delay circuit, a second one of the three clock signals to the blender circuit, and a third one of the three clock signals to the buffer circuit.

Example 19 includes the method of Example 17, where the rising edge of the input clock signal has substantially the same slope as the rising edge of the blended clock signal at the crossing of the midpoint value.

Example 20 includes the method of Example 17, where the blended clock signal is a weighted average of the input clock signal and the delayed clock signal, the method further including setting, by a weight adjustment circuit of the IC according to a specified weight value or values, weights of the input clock signal and the delayed clock signal used by the blender circuit to produce the weighted average of the input clock signal and the delayed clock signal.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. In addition, various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A duty cycle adjustment circuit comprising:
   a delay circuit to delay an input clock signal to produce a delayed clock signal having a rising edge partially overlapping the rising edge of the input clock signal, the input clock signal oscillating between a first value and a second value through a midpoint value, the first value being on a first side of the midpoint value, the second value being on a second side of the midpoint value opposite the first side, the first value corresponding to a digital high, the second value corresponding to a digital low;
   a blender circuit to blend the input clock signal and the delayed clock signal to produce a blended clock signal;
   a buffer circuit to buffer the input clock signal for the amount of time the blender circuit takes to produce the blended clock signal from the input clock signal and the delayed clock signal, to produce a buffered clock signal; and
   a combiner circuit to combine the buffered clock signal and the blended clock signal to produce an output clock signal that transitions to or remains at or about the first value when the buffered clock signal and the blended clock signal are on the first side of the midpoint value, and otherwise transitions to or remains at or about the second value.

2. The duty cycle adjustment circuit of claim 1, further comprising a splitter circuit to:
split the input clock signal into three clock signals each having substantially the same waveform and phase offset as the input clock signal; and
connect a first one of the three clock signals to the delay circuit, a second one of the three clock signals to the blender circuit, and a third one of the three clock signals to the buffer circuit.

3. The duty cycle adjustment circuit of claim 1, wherein the rising edge of the input clock signal has substantially the same slope as the rising edge of the blended clock signal at the crossing of the midpoint value.

4. The duty cycle adjustment circuit of claim 1, wherein the delayed clock signal is delayed from the input clock signal by about half the length of the rising edge of the input clock signal.

5. The duty cycle adjustment circuit of claim 1, further comprising a delay adjustment circuit to control the blending of the input clock signal and the delayed clock signal in the blender circuit.

6. The duty cycle adjustment circuit of claim 1, wherein the blended clock signal is a weighted average of the input clock signal and the delayed clock signal.

7. The duty cycle adjustment circuit of claim 6, further comprising a delay adjustment circuit to set, according to a specified weight value or values, weights of the input clock signal and the delayed clock signal used by the blender circuit to produce the weighted average of the input clock signal and the delayed clock signal.

8. The duty cycle adjustment circuit of claim 1, wherein the input clock signal has a frequency of at least 500 megahertz (MHz).

9. The duty cycle adjustment circuit of claim 1, wherein the duty cycle adjustment circuit is implemented in heterojunction bipolar transistor (HBT) technology including one or both of an indium phosphide (InP) HBT structure and a silicon germanium (SiGe) HBT structure, wherein the InP HBT structure has an emitter region that includes indium (In) and phosphorus (P), and the SiGe HBT structure has a base region that includes silicon (Si) and germanium (Ge).

10. A digital-to-analog converter (DAC) circuit comprising the duty cycle adjustment circuit of claim 1.

11. A data converter integrated circuit (IC) comprising:
a plurality of interleaved data converter circuits; and
an input clock signal generator to generate and distribute respective input clock signals to the interleaved data converter circuits,
wherein a data converter circuit of the interleaved data converter circuits is configured to receive an input clock signal of the respective input clock signals, the input clock signal oscillating between a first value and a second value through a midpoint value, the first value being on a first side of the midpoint value, the second value being on a second side of the midpoint value opposite the first side, the first value corresponding to a digital high, the second value corresponding to a digital low, the data converter circuit comprising a duty cycle adjustment circuit, the duty cycle adjustment circuit including
a delay circuit to delay the input clock signal to produce a delayed clock signal having a rising edge partially overlapping the rising edge of the input clock signal,
a blender circuit to blend the input clock signal and the delayed clock signal to produce a blended clock signal,
a buffer circuit to buffer the input clock signal for the amount of time the blender circuit takes to produce the blended clock signal from the input clock signal and the delayed clock signal, to produce a buffered clock signal, and
a combiner circuit to combine the buffered clock signal and the blended clock signal to produce an output clock signal that transitions to or remains at or about the first value when the buffered clock signal and the blended clock signal are on the first side of the midpoint value, and otherwise transitions to or remains at or about the second value.

12. The data converter IC of claim 11, wherein the duty cycle adjustment circuit further includes a splitter circuit to:
split the input clock signal into three clock signals each having substantially the same waveform and phase offset as the input clock signal; and
connect a first one of the three clock signals to the delay circuit, a second one of the three clock signals to the blender circuit, and a third one of the three clock signals to the buffer circuit.

13. The data converter IC of claim 11, wherein the rising edge of the input clock signal has substantially the same slope as the rising edge of the blended clock signal at the crossing of the midpoint value.

14. The data converter IC of claim 11, wherein the duty cycle adjustment circuit further includes a delay adjustment circuit to control the blending of the input clock signal and the delayed clock signal in the blender circuit.

15. The data converter IC of claim 11, wherein the blended clock signal is a weighted average of the input clock signal and the delayed clock signal, the duty cycle adjustment circuit further including a delay adjustment circuit to set, according to a specified weight value or values, weights of the input clock signal and the delayed clock signal used by the blender circuit to produce the weighted average of the input clock signal and the delayed clock signal.

16. The data converter IC of claim 11, wherein the interleaved data converter circuits are digital-to-analog converter (DAC) circuits.

17. A method of adjusting a duty cycle by an integrated circuit (IC), the method comprising:
delaying, by a delay circuit of the IC, an input clock signal to produce a delayed clock signal having a rising edge partially overlapping the rising edge of the input clock signal, the input clock signal oscillating between a first value and a second value through a midpoint value, the first value being on a first side of the midpoint value, the second value being on a second side of the midpoint value opposite the first side, the first value corresponding to a digital high, the second value corresponding to a digital low;
blending, by a blender circuit of the IC, the input clock signal and the delayed clock signal to produce a blended clock signal;
buffering, by a buffer circuit of the IC, the input clock signal for the amount of time the blender circuit takes to produce the blended clock signal from the input clock signal and the delayed clock signal, to produce a buffered clock signal; and
combining, by a combiner circuit of the IC, the buffered clock signal and the blended clock signal to produce an output clock signal that transitions to or remains at or about the first value when the buffered clock signal and the blended clock signal are on the first side of the midpoint value, and otherwise transitions to or remains at or about the second value.

18. The method of claim 17, further comprising:

splitting, by a splitter circuit of the IC, the input clock signal into three clock signals each having substantially the same waveform and phase offset as the input clock signal; and connecting, by the splitter circuit, a first one of the three clock signals to the delay circuit, a second one of the three clock signals to the blender circuit, and a third one of the three clock signals to the buffer circuit.

19. The method of claim 17, wherein the rising edge of the input clock signal has substantially the same slope as the rising edge of the blended clock signal at the crossing of the midpoint value.

20. The method of claim 17, wherein the blended clock signal is a weighted average of the input clock signal and the delayed clock signal, the method further comprising setting, by a weight adjustment circuit of the IC according to a specified weight value or values, weights of the input clock signal and the delayed clock signal used by the blender circuit to produce the weighted average of the input clock signal and the delayed clock signal.

* * * * *